(12) United States Patent
Fujita et al.

(10) Patent No.: US 8,717,027 B2
(45) Date of Patent: *May 6, 2014

(54) ORGAN VIABILITY

(76) Inventors: Hiroyuki Fujita, Highland Heights, OH (US); John L. Patrick, Chagrin Falls, OH (US); Ronald B. Richard, Cleveland Heights, OH (US)

( * ) Notice: Subject to any disclaimer, the term of this patent is extended or adjusted under 35 U.S.C. 154(b) by 523 days.

This patent is subject to a terminal disclaimer.

(21) Appl. No.: 12/978,882

(22) Filed: Dec. 27, 2010

(65) Prior Publication Data

US 2012/0161770 A1 Jun. 28, 2012

(51) Int. Cl.
*G01R 33/44* (2006.01)
*G01R 33/48* (2006.01)
*G01R 33/30* (2006.01)
*G01R 33/465* (2006.01)
*G01R 33/36* (2006.01)

(52) U.S. Cl.
CPC .............. *G01R 33/30* (2013.01); *G01R 33/465* (2013.01); *G01R 33/3635* (2013.01)
USPC .......................................... 324/321; 324/309

(58) Field of Classification Search
CPC ... G01R 33/30; G01R 33/465; G01R 33/3635
USPC .......................................................... 324/321
See application file for complete search history.

(56) References Cited

U.S. PATENT DOCUMENTS 4,920,044 A * 4/1990 Bretan, Jr. .................... 435/1.1

OTHER PUBLICATIONS

Lockett, C. J., Fuller, B. J., Busza, A. L. and Proctor, E. (1995), Hypothermic perfusion preservation of liver: the role of phosphate in stimulating ATP synthesis studied by 31P NMR. Transplant International, 8: 440-445. doi: 10.1111/j.1432-2277.1995.tb01553.x.*
Boska, et al., "Image-Guided 31P Magnetic Resonance Spectroscopy of Normal and Transplanted Human Kidneys", Kidney International, vol. 38 (1990), pp. 294-300, International Society of Nephrology.
Buchs, et al., "Interactive CardioVascular and Thoracic Surgery", http://icvts.ctsnetjournals.org/cgi/content/full/6/4/421, Copyright 2007 by European Association for Cardio-Thoracic Surgery, pp. 420-425.
Niekisch, et al., "Improved Pretransplant Assessment of Renal Quality by Means of Phosphorus-31 Magnetic Resonance Spectroscopy Using Chemical Shift Imaging", Transplantation, vol. 77, 1041-1045, No. 7, Apr. 15, 2004.

(Continued)

*Primary Examiner* — Melissa Koval
*Assistant Examiner* — Rishi Patel

(57) ABSTRACT

Apparatuses, methods, and other embodiments associated with determining organ viability are described. According to one embodiment, an apparatus includes logic configured to apply nuclear magnetic resonance (NMR) energy to a kidney positioned in a hypothermic pulsative perfusion (HPP) apparatus. The NMR energy is produced according to an MRS $^{31}$P specific pulse sequence. The HPP apparatus has an integrated RF coil. The HPP may also have an integrated magnet. The RF coil is positioned and oriented to facilitate optimizing $^{31}$P MRS of the kidney. The apparatus also includes logic configured to receive spectrum data from the kidney. The spectrum data is produced in response to applying the NMR energy to the kidney. The apparatus also includes logic configured to provide objective, quantitative kidney viability data (e.g., PME/Pi, ATP/ADP) from the spectrum data. More generally, MRI/MRS compatible HPP apparatuses are configured to interact with dedicated NMR spectroscopy apparatuses.

15 Claims, 4 Drawing Sheets

(56) References Cited

OTHER PUBLICATIONS

Buchs, et al., "Oxygenated Hypothermic Pulsatile Perfusion Versus Cold Static Storage for Kidneys From Non Heart Beating Donors Tested by in Line ATP Resynthesis to Establish a Strategy of Preservation", http://prf.sagepub.com/content/early/2010/10/16/0267659110387184, Perfusion, pp. 1-7.

* cited by examiner

ORGAN VIABILITY

BACKGROUND

Organ transplants require viable organs. For example, a successful kidney transplant requires a viable kidney. Currently, the number of patients waiting for kidneys far exceeds the number of kidneys available for donation. Similar conditions exist for other organs. Thus, attempts have been made to expand the donor pool for kidneys. For example, in addition to healthy volunteers (e.g., twin brother), kidneys may be harvested from brain-dead donors and even from heart-dead donors. Unfortunately, conventionally, there has been no objective, quantitative, non-invasive method to determine whether a kidney is viable. Visual observation of a kidney while being perfused is purely subjective and thus sub-optimal. Microdialysis and other invasive approaches can alter local tissue hemodynamics and metabolism and lead to unreliable and/or undesirable results. One conventional viability test involved performing a harvest-time biopsy. Unfortunately, in addition to being invasive and damaging cells, the biopsy may lead to potentially misleading results. For example, a biopsy may incorrectly report that a kidney is not viable because data may be acquired from cells damaged by the biopsy. Additionally, a kidney may be identified as being viable by the biopsy but then incur additional ischemic damage during transport that makes the kidney become non-viable. Therefore, there is a long felt and unmet need for objective, quantitative organ viability measurements acquired using a non-invasive approach that can be made in a transport/transplant relevant time frame.

The following defines acronyms that will be used throughout this application:
ATP adenosine triphosphate
ADP adenosine diphosphate
CSI chemical shift imaging
CSS cold static storage
HPP hypothermic pulsative perfusion
MR magnetic resonance
MRI magnetic resonance imaging
MRS magnetic resonance spectroscopy
NHBD non-heart beating donors
NMR nuclear magnetic resonance
Pi inorganic phosphorous
PME phosphomonoesther
PRESS point resolved spectroscopy
RF radio frequency
T Tesla As early as 1990, papers like that by Boska, et al., Image Guided $^{31}$P Magnetic Resonance Spectroscopy (MRS) of Normal and Transplanted Human Kidneys, Kidney International, Vol. 38 (1990), pp 294-300, have reported that image guided $^{31}$P MRS of kidneys is possible. Boska described measuring and analyzing ratios like PME/ATP and Pi/ATP from data acquired during an hour long acquisition in a 2 T system using a spatially localized technique to obtain $^{31}$P MR kidney spectra in vivo and in situ.

In 2004, Niekisch et al., reported in Improved Pretransplant Assessment of Renal Quality By Means of Phosphorus-31 Magnetic Resonance Spectroscopy Using Chemical Shift Imaging, Transplantation, Vol. 77, 1041-1045, No. 7, Apr. 15, 2004, that $^{31}$P MRS can indicate graft quality by analyzing the ratio of PME to Pi in kidney. Niekisch describes a volume selective $^{31}$P-MRS using CSI. CSI was performed in a 2 T system using a standard PRESS sequence. Niekisch describes using two coils. A double tuned quadrature birdcage coil was used for RF excitation at both the $^1$H and $^{31}$P frequencies. The same coil was used for $^1$H imaging. A separate $^{31}$P actively decoupled loop coil was used to receive the $^{31}$P spectra signal from which the peaks were isolated. With the peaks isolated, the ratios could be computed. PME/Pi was calculated as an average PME/Pi value of all voxels containing the two metabolites. Niekish even cited back to an "early 80s study" by Chan et al., Studies of Human Kidneys Prior to Transplantation by Phosphorous NMR, in PEGG, et al., editors, Organ Preservation For Transplantation, New York, MTP Press, 1981, that described $^{31}$P spectroscopy of kidneys.

Thus, for at least two decades, scientists have researched $^{31}$P MRS for kidneys. However, none of this research has lead to a surgically relevant test for viability that can be performed in a timely manner in the multiplicity of locations where kidneys are harvested and transplanted. Therefore, non-viable kidneys continue to be transported and even, in some cases, transplanted. Similar research and issues exist for other organs.

Simply harvesting more kidneys would not solve the kidney transplant issue because once a kidney is harvested, it must be transported. While we are all familiar with the television portrayal of kidneys being transplanted in a cooler full of ice, the reality of 2010 is much different.

The reality of 2010 includes HPP machines like those described in 2007 in Buchs, et al., Interactive Cardio Vascular and Thoracic Surgery 6 (2007) 421-424, DO1:10.1510/icvts.2006.146043. Buchs describes an HPP machine for kidney perfusion that is also suitable for $^{31}$P NMR spectroscopy in a conventional MRI bore. Buchs describes computing the ratio of PME/Pi obtained from $^{31}$P spectroscopy where "$^{31}$P NMR spectroscopy will be realized in a classical MRI apparatus transformed for the tests with a specific P-coil". The Buchs apparatus includes three parts: an igloo, a drive module, and an umbilical cord. The "igloo" is a chamber that holds the kidney to be perfused. The chamber includes a disposable part, has a maximum size of 40 cm, and is suited for being placed in the bore of a conventional MRI apparatus. The maximum size is limited by the inner dimensions of the bore in the conventional MRI apparatus. The drive module provides positive $O_2$ pressure and is not suited for placement in the bore of a conventional MRI apparatus. Thus, the umbilical cord, which is described as being 7 m long, connects the chamber to the drive module so that the chamber can be placed in the bore of an MRI apparatus while the drive module can be placed farther away from the bore where it will not be damaged by or damage the conventional MRI apparatus.

In 2010, Buchs reported even more recent data concerning $^{31}$P MRS in Buchs, et al., MRS for Organ Viability, Perfusion, (2010), DO1:10.1177/0267659110387184. Buchs reported that it is experimentally possible to evaluate the viability of organs during their re-perfusion after harvest by measuring ATP resynthesis using $^{31}$P MRS. Buchs relies on the fact that "the main marker of mitochondrial dysfunction is ATP depletion, which leads to apoptosis by activation of proaptic capsase enzymes." Once again Buchs relies on a multi-part apparatus that includes a chamber, an umbilical cord, and a drive unit. This conventional system includes a chamber with a maximum size of 45 cm that is configured to fit in the bore of a conventional MRI apparatus. This conventional system also includes the support unit, which is connected to the chamber by a long umbilical cord so that it can sit "outside the Faraday Cage of the room the bore is in." This conventional apparatus uses a "home made surface P-coil placed on the bottom of the chamber" to facilitate conducting phosphorous on a resonance at a frequency of 49.9 MHz in a 3 T B0 field.

Thus, NMR spectroscopy can provide information upon which a kidney viability decision can be made. NMR spectroscopy depends upon the fact that when placed in a magnetic field, NMR active nuclei (e.g., $^1$H, $^{31}$P) absorb at a frequency characteristic of the isotope. The resonant frequency, energy of the absorption, and the intensity of the signal are proportional to the strength of the magnetic field. NMR spectroscopy can also provide information on which the viability of other organs can be analyzed.

Depending on the local chemical environment, different protons in a molecule resonate at slightly different frequencies. Since both this frequency shift and the fundamental resonant frequency are directly proportional to the strength of the magnetic field, the shift is converted into a field-independent dimensionless value known as the chemical shift. The chemical shift is reported as a relative measure from some reference resonance frequency. This difference between the frequency of the signal and the frequency of the reference is divided by frequency of the reference signal to give the chemical shift. Frequency shifts may be extremely small in comparison to the fundamental NMR frequency. For example, a frequency shift might be only 100 Hz compared to a fundamental NMR frequency of 100 MHz. Thus, the chemical shift is generally expressed in parts per million (ppm). The chemical shift can be used to obtain some structural information about the molecule in a sample. The shape and size of peaks are indicators of chemical structure. FIG. 1 illustrates one example output from a chemical shift MRS of a kidney. Peaks are visible for PME, Pi, αATP, and βATP. The papers discussed in the background described how these peaks can be used to evaluate kidney viability. Chemical-shift MRI of other organs using other nuclei provides other information concerning organ viability.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one example of the boundaries. In some examples, one element may be designed as multiple elements or multiple elements may be designed as one element. In some examples, an element shown as an internal component of another element may be implemented as an external component and vice versa. Furthermore, elements may not be drawn to scale.

DETAILED DESCRIPTION

Figure 1:
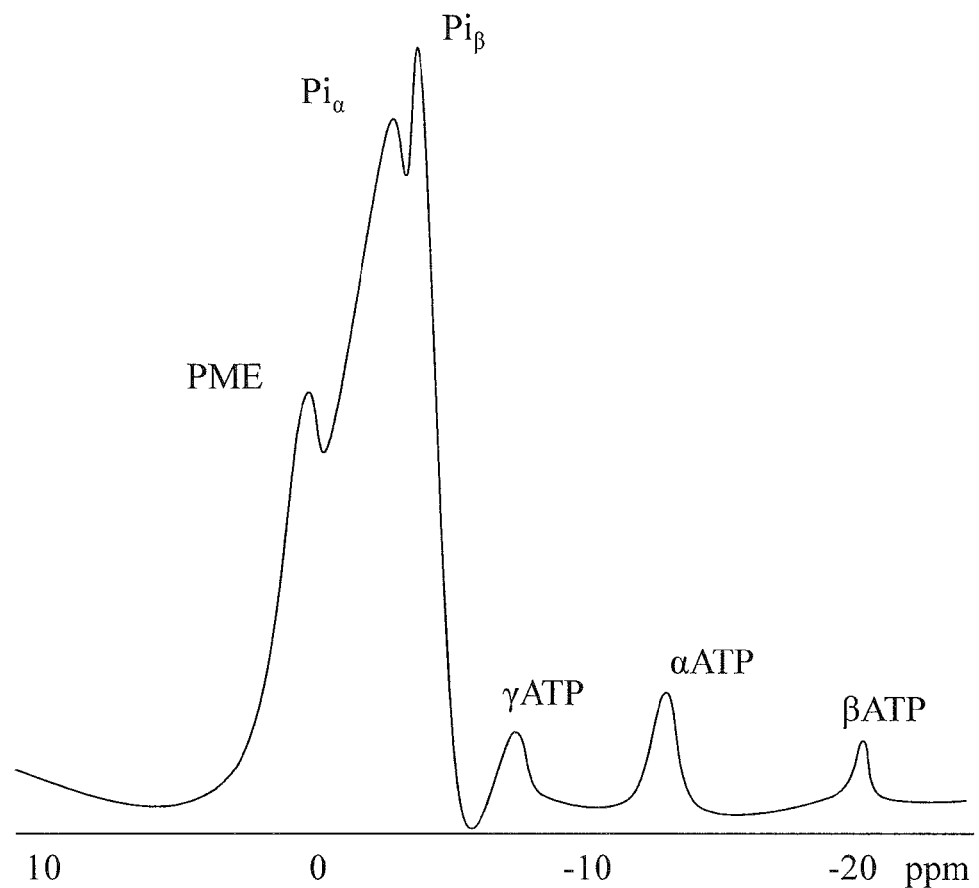
FIG. 1 illustrates an example output from a chemical shift MRS of a kidney.

Described herein are example apparatuses and methods associated with a dedicated MR apparatus configured to interact with an HPP apparatus that is integrated with at least one MR specific element (e.g., coil, magnet). In one embodiment, the dedicated MR apparatus performs MRS on an organ in the HPP apparatus using a high field (e.g., 3 T) with a conventional pulse sequence. In another embodiment, the dedicated MR apparatus performs MRS on an organ in the HPP apparatus using a lower field with an organ viability specific pulse sequence (OVSPS) that acquires organ viability specific data in a shorter period of time than conventional systems.

More generally, described herein are example apparatuses and methods associated with improving workflow and accuracy in determining organ viability. Example apparatuses integrate one or more MR elements (e.g., coil, magnet) into an organ holding container. Example dedicated apparatuses are configured to work with the integrated containers to perform one and/or multi-nucleus NMR (e.g., $^1$H, $^{13}$C, $^{23}$NA, and $^{31}$P) in a more surgically relevant time frame. The combination of elements facilitate acquiring objective quantitative data upon which an organ viability determination can be made. While kidney is referred to most frequently in this application, the apparatus and techniques are more generally applicable.

NMR spectroscopy provides an NMR spectrum. An NMR spectrum provides information on the number and type of chemical entities in a molecule. In one embodiment, NMR spectroscopy is performed on a kidney to obtain a $^{31}$P spectrum from which spectral peaks can be identified. Peaks associated with one or more of PME, Pi, αATP, βATP, and NAD/H are identified. Data from which an organ viability determination can be made is then computed from the peaks. The data includes, for example, a PME/Pi ratio, and an αATP/βATP ratio. In other examples, different nuclei may be examined in different organs.

Unlike the experimental and research systems that were designed to facilitate better understanding the transplant environment and the effect of HPP modules, example systems and methods concern integrated, mobile, and transportable units that interact with dedicated organ viability MR equipment to achieve improved flow in the harvest, analysis, transport, analysis, transplant, workflow. Unlike conventional systems that require numerous technician and operator interventions (e.g., coil selection, coil placement, pulse sequence selection, chamber positioning, field clearing), example systems and methods provide simplified and optimized (e.g., "one touch") processing. Since the MR apparatus is dedicated to organ viability, in one embodiment the pulse sequence may be pre-selected, as may pulse parameters (e.g., TR, TE, flip angle, nucleus/nuclei to excite). Thus, a single operation (e.g., one button press, one voice command), or a fewer number of operations than in a conventional system can be issued to begin organ viability analysis. Similarly simple actions and/or commands can be used to progress through various steps in a spectroscopy session (e.g., localization, peak RF identification, RF power setting, shimming, signal acquisition). In the dedicated apparatus, these actions may be more simple to perform than in a conventional, general purpose apparatus. Since time may be of the essence in organ viability, removing the time-consuming setup in conventional systems may lead to more donor organs remaining viable up until analysis and transplant time.

One example system includes an organ transfer container with a sterile, disposable inner liner. In one embodiment, the liner positions the organ in a known position and/or orientation. The container is made from MR compatible materials (e.g., non-ferromagnetic). The container may be configured to provide temperature monitoring and control, humidity monitoring and control, and monitoring and control of other environmental factors. In one embodiment, a $^1$H/$^{31}$P coil is integrated into the container. In another embodiment, both a $^1$H coil and a $^{31}$P coil are integrated into the container. Other embodiments may employ other coils to perform spectroscopy for other nuclei in other organs. Integrating the coil into the container removes at least one step from the transport/transplant workflow. For example, a technician will not have to find the appropriate coil and then position the appropriate coil in the optimal location for MR applications. Instead, the coil will already be in place, and will already be placed correctly. Having the organ in a known orientation that agrees with the coil position facilitates acquiring more consistent data. Since time may be of the essence in the transport/transplant workflow, removing the steps of finding and positioning the coil may allow a shorter workflow time which may in turn lead to more organs remaining viable. Also, since both the organ and the coil will be positioned in a known correct orientation, the potentially fatal step of having to open the container and reposition the organ for MRI/MRS will be eliminated. Once again, this may lead to more organs remaining viable.

One example system includes a pulsatile perfusion support system. The support system may include, for example, a control processor, an oxygen pressure source, and a power supply arranged in a mobile unit. The support system is configured to operate in close proximity to the dedicated MR system. Thus, unlike conventional systems that require a lengthy (e.g., 7 m) umbilical cord to be run from a conventional bore to outside the Faraday cage surrounding a conventional system, the mobile system that conveys the support system may be placed closer to the dedicated MR apparatus. In one embodiment, the dedicated MR apparatus may include one or more support system elements. Thus, the mobile, transportable support system may be used in transit and the support system elements that are integrated into or otherwise associated with the dedicated MR apparatus may be used after transit. This facilitates using conventional non-MR compatible support systems for transport and using MR compatible support systems after transit.

One example system also includes a dedicated MR apparatus configured to perform organ viability testing. Conventional MRI apparatuses are configured to produce a wide variety of images using a wide variety of pulse sequences. For example, images of torn knee ligaments, of damaged hip joints, of brains, and even of blood flow may be acquired using a single conventional system that can be programmed to perform a large number of pulse sequences with a large number of different parameters. While this is suitable for general purpose analytic functions, this needlessly complicates and slows down the transport/transplant workflow. Similarly, conventional MRS apparatus may be configured to analyze a wide variety of nuclei in objects of widely varying sizes. In contrast, the dedicated MR apparatus is configured to receive the container and its integrated MR components (e.g., coil) and to apply a pre-determined pulse sequence to acquire organ viability data that is based on a finite set of nuclei that may be present in organs whose shapes and sizes vary within well known ranges. Rather than being a widely configurable general purpose device, the dedicated MR apparatus may have a small number of pre-determined pulse sequences available for different analyses of a small number of samples.

In one embodiment, the dedicated MR apparatus does not need to be able to produce an image. Instead, the dedicated MR apparatus only needs to be able to produce the relevant organ viability data including, for example, PME/Pi ratio, ATP/ADP ratio, and so on. Therefore, in one example, the dedicated MR apparatus is configured to perform MRS based CSI in much shorter times than conventional systems. In one example, the dedicated MR apparatus may perform MRS based CSI in under one minute. The MR apparatus may be suitable for installation in the transplant ward. This facilitates reducing transit time and facilitates having transplant trained staff retain control of the organ at all times. Both of these reduce the potential for transit related damage. Additionally, other specialized equipment that is available in the transplant ward may be more readily available.

Figure 2:
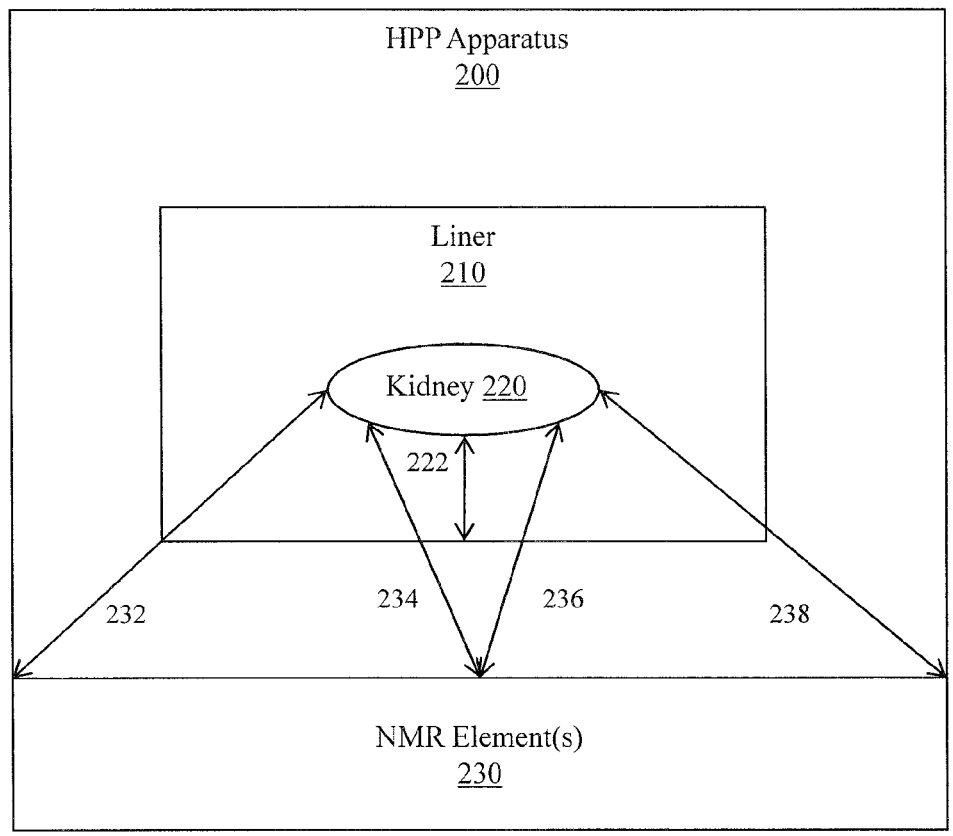
FIG. 2 illustrates one embodiment of an HPP apparatus configured with an integrated NMR element to facilitate improved workflow and accuracy in determining organ viability.

FIG. 2 illustrates a hypothermic pulsatile perfusion (HPP) apparatus 200. HPP apparatus 200 includes a sterile, disposable inner liner 210 and one or more integrated NMR/MR elements 230. The liner 210 is configured to house an organ. The organ may be, for example, a kidney 220. In one embodiment, the liner 210 is configured to maintain the organ in a pre-determined position and/or orientation relative to the one or more NMR elements 230. HPP apparatus 200 is constructed from non-ferromagnetic materials and is, therefore, MR compatible.

FIG. 2 illustrates a kidney 220 being held by liner 210. Liner 210 may be configured to hold kidney 220 in a fixed position or in a position that is fixed to within a tolerance so that measurements like those represented by 222, 232, 234, 236, and 238 (e.g., distance from kidney 220 to edge of liner 210, distance from kidney 220 to edge of NMR element(s) 230, distance from kidney 220 to center of NRM element(s) 230) remain constant or constant to within a tolerance. Liner 210 may be partially filled with a fluid in which the kidney 220 is suspended or otherwise supported. Holding the kidney 220 in this way facilitates accurately positioning the kidney 220 in a sensitive volume produced by an NMR apparatus that will be used to perform NMR based spectroscopy of the kidney 220. Minimizing the required size of the sensitive volume facilitates having a smaller, lighter, more mobile NMR apparatus. While a kidney is illustrated, other liners 210 may be employed for other organs.

One or more nuclear magnetic resonance (NMR) elements 230 are integrated into the HPP apparatus 200. The one or more NMR elements 230 are configured to facilitate performing actions on the organ including, but not limited to, MRS, and MRI. The NMR elements 230 may include, for example, an RF coil, a magnet, a shim, and/or a shim pair.

In one example, an integrated RF coil is a $^1$H/$^{31}$P coil. One skilled in the art will appreciate that other coils designed for use with other nuclei may be employed. The RF coil may be positioned and oriented with respect to the pre-determined position and orientation of the organ to facilitate optimizing spectroscopy. In one example, the RF coil may be positioned to optimize chemical shift $^{31}$P MRS of the kidney 220. In other examples, the RF coil may be positioned and oriented to facilitate performing actions including, but not limited to, single-sided spectroscopy of an organ, and mobile spectroscopy on an organ using a closed magnet.

In one example, an integrated magnet member of the NMR elements 230 is configured to contribute to a magnetic field suitable for use in applications concerning the organ including, but not limited to, MRS, MRI, chemical shift MRS, unipolar, and unilateral MRI. In different embodiments, different magnets may produce magnetic fields of different strengths (e.g., 3 T, 1.5 T).

Thus, in different examples, the combination of an integrated RF coil(s) and an integrated magnet(s) may facilitate performing actions including, but not limited to, single-side spectroscopy of an organ, mobile spectroscopy of an organ, MRS, MRI, chemical shift MRS, and unilateral MRI.

Apparatus 200 may also include a temperature, humidity, and/or light-level monitoring apparatus and a temperature, humidity, and light-level controlling apparatus. In one embodiment, apparatus 200 may have at least one transparent portion that is configured to facilitate viewing the organ. In one embodiment, the apparatus 200 is smaller than conventional HPP apparatuses. In one embodiment, the apparatus 200 may weigh less than five pounds and/or occupy a volume of less than 1,000 cubic centimeters. This smallness makes the HPP apparatus 200 more mobile than conventional HPP apparatuses. This smallness also makes HPP apparatus 200 consume much less space for the installation.

Apparatus 200 may be configured to be placed in a dedicated MR apparatus that is configured to perform MRS and/or MRI of the organ. Additionally, and/or alternatively, apparatus 200 may be configured to be positioned in a known location relative to the dedicated MR apparatus, to be attached to the MR apparatus, to be mounted on or in the MR apparatus, and so on. Arranging the apparatus 200 in a known location relative to the MR apparatus facilitates optimizing MR applications and reducing overall system size.

Figure 3:
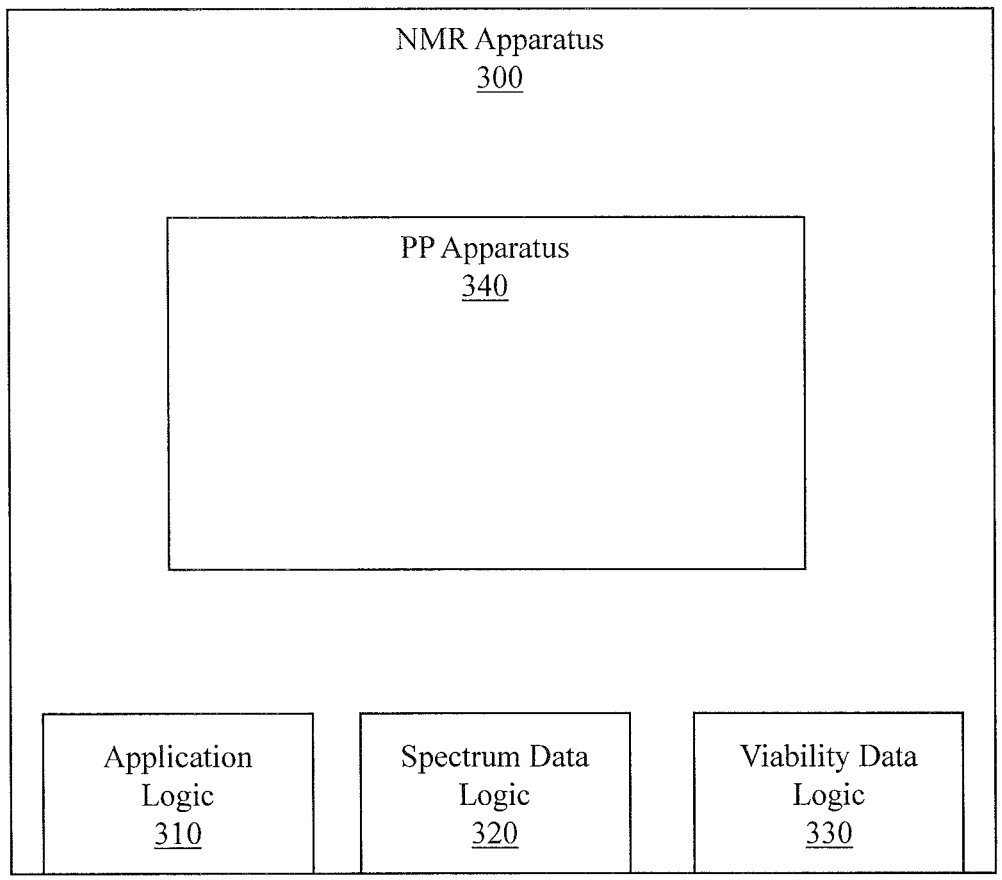
FIG. 3 illustrates one embodiment of a dedicated NMR apparatus configured to improve workflow and accuracy in determining organ viability.

FIG. 3 illustrates an NMR apparatus 300. Apparatus 300 includes an application logic 310 that is configured to apply NMR energy to an organ positioned in a pulsatile perfusive (PP) apparatus 340. In one embodiment, the PP apparatus 340 may be similar to HPP apparatus 200 (FIG. 2). In one example, the NMR energy is produced in accordance with a pulse sequence designed to excite one or more specific types of nuclei in the organ. The different types of nuclei include, but are not limited to, $^1$H, $^{13}$C, $^{23}$NA, and $^{31}$P. The organ may be, for example, a kidney, a heart, a lung, or other organ. When the organ is a kidney, the specific nuclei may include $^1$H, and $^{31}$P.

Apparatus 300 also includes a spectrum data logic 320 that is configured to receive spectrum data from the organ. The spectrum data is produced in response to applying the NMR energy to the organ. The spectrum data may include peaks that can be analyzed to provide viability data. The spectrum data may include data concerning, for example, PME, Pi, αATP, and βATP.

Apparatus 300 also includes a viability data logic 330 that is configured to provide objective, quantitative organ viability data from the spectrum data. When the organ is a kidney, the organ viability data may include, for example, a PME peak data, a Pi peak data, an ATP peak data, and an ADP peak data. When the organ is something other than a kidney, other peaks may be acquired and examined. In one example, the apparatus 300 is configured to acquire the peak data in less than one minute.

In one example, an RF coil is integrated into PP apparatus 340. The RF coil is positioned and oriented to facilitate optimizing NMR spectroscopy of the organ. Therefore, delivering the NMR energy and/or receiving the spectrum data may depend, at least in part, on the RF coil integrated into the PP apparatus 340. In different examples, the RF coil may be positioned to facilitate performing single sided spectroscopy on the organ, to facilitate performing unilateral NMR on the organ outside a magnet associated with the apparatus, and to facilitate performing other tasks.

Unlike conventional MRI apparatuses which are fixed and stationary, in one embodiment the NMR apparatus 300 is mobile. The mobility is achieved by having the unit be smaller and lighter than conventional systems. In one example, NMR apparatus 300 occupies less than one cubic meter.

Different embodiments of NMR apparatus 300 may operate with different magnetic fields (e.g., 3 T, 1.5 T). Performing NMR spectroscopy with smaller magnetic fields may be facilitated by precisely positioning the item to be analyzed in a small sensitive volume. Therefore, NMR apparatus 300 is configured to hold the PP apparatus 340 in a pre-determined fixed position relative to the NMR apparatus 300 and to hold the PP apparatus 340 in a pre-determined fixed orientation relative to the NMR apparatus 300.

Figure 4:
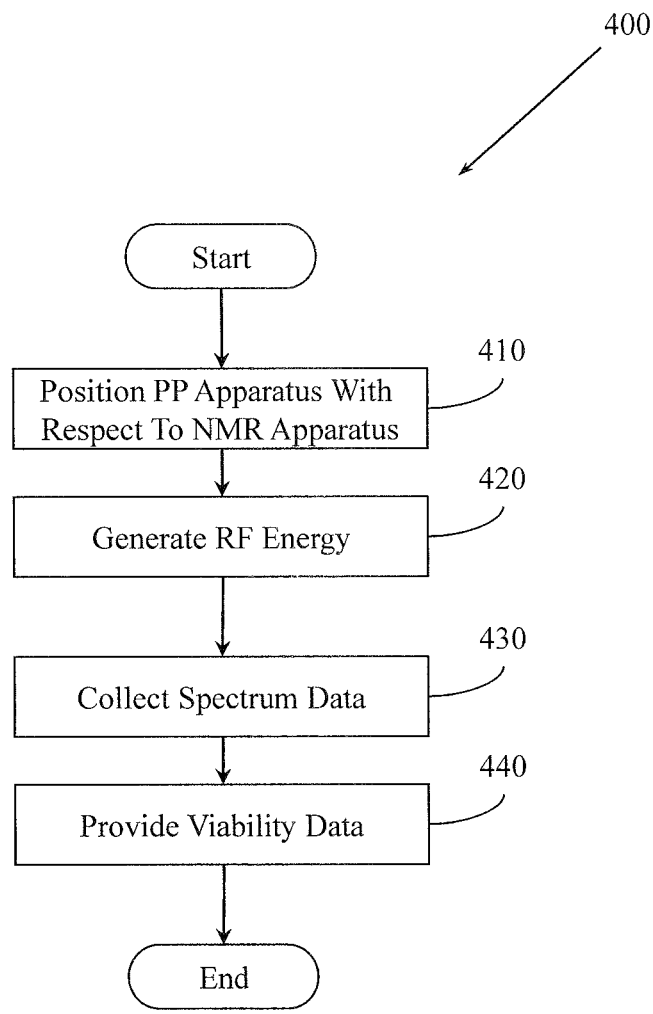
FIG. 4 illustrates one embodiment of a method associated with acquiring organ viability data from dedicated and integrated apparatuses configured to improve workflow and accuracy.

FIG. 4 illustrates a method 400. Method 400 includes, at 410, positioning a pulsatile perfusion (PP) apparatus with respect to an NMR spectroscopy apparatus. The PP apparatus is positioned to facilitate performing NMR spectroscopy on an organ located in the PP apparatus. In one example, the PP apparatus will be inserted into the NMR spectroscopy apparatus. In another example, the PP apparatus will be attached to an attachment point on or in the NMR spectroscopy apparatus. In one embodiment, the PP apparatus has a chamber configured to house the organ in a known, fixed position and in a known, fixed orientation. Having the organ in a known, fixed position and orientation, and having a standard sized PP apparatus that mounts, is attached to, is inserted into, or is otherwise positioned in a known location with respect to the NMR spectroscopy apparatus facilitates improving and/or optimizing several aspects of NMR spectroscopy. While a known, fixed position and orientation are described, example apparatuses and methods are not so limited. In one embodiment, the organ may be floating in or otherwise immersed in a fluid inside the PP apparatus. In this embodiment, the location of the organ may not be as fixed but may instead simply be known to be within the confines of the PP apparatus.

One or more MR elements (e.g., RF coil, magnet) are integrated into the PP apparatus. These MR elements are configured to facilitate performing MRS and/or MRI on the organ. Thus, rather than having to locate and correctly position an NMR/MR element (e.g., RF coil), the element may already by optimally pre-positioned.

Method 400 also includes, at 420, controlling the NMR/MR spectroscopy apparatus to apply RF energy to the organ. Since the PP apparatus has NMR/MR elements integrated into it, applying the RF energy may depend, at least in part, on the one or more NMR/MR elements integrated into the PP apparatus. In one example, the RF energy is produced in accordance with a pulse sequence designed to excite one or more of, $^1$H, $^{13}$C, $^{23}$NA, and $^{31}$P. One skilled in the art of spectroscopy will appreciate that other nuclei and other combinations of nuclei may be examined using different configurations, magnetic fields, and pulse sequences.

Method 400 also includes, at 430, controlling the NMR spectroscopy apparatus to receive spectrum data from the organ. The spectrum data will be produced in response to applying the RF energy to the organ. Once again, since the PP apparatus has NMR elements integrated into it, receiving the spectrum data may depend, at in part, on the more NMR/MR elements integrated into the PP apparatus.

Method 400 also includes, at 440, controlling the NMR/MR spectroscopy apparatus to provide objective, quantitative organ viability data from the spectrum data.

In one embodiment, a system includes a magnetic resonance imaging (MRI) apparatus configured to operate at an MRI active time and a perfusion apparatus configured to operate at a perfusion active time. The perfusion apparatus is configured to maintain perfusion in an excised organ upon which the MRI apparatus will perform an MRI operation. During MRI active time, the MRI apparatus may produce RF energy. During perfusion active time, the perfusion apparatus may produce RF energy, vibrations, electromagnetic energy, and so on. Thus, in one example, the system is configured to control the MRI active time and/or the perfusion active time to reduce one or more of, electromagnetic interference, and mechanical vibration, between the MRI apparatus and the perfusion apparatus.

In one example, the perfusion apparatus is a pulsatile perfusion apparatus. Therefore, controlling the perfusion active time may include controlling the advent of pulsatile activation. In another example, controlling the perfusion active time may include controlling one or more elements of the perfusion apparatus to enter one or more of, a powered off state, a reduced power state, and a selected mechanical operating state. Thus, the system may be controlled so that while the MRI apparatus is active the perfusion apparatus will be turned off, powered down, or otherwise configured to reduce, minimize, and/or eliminate interface from the perfusion apparatus with the MRI apparatus.

The MRI apparatus may be configured to produce a substantially homogenous spatial distribution in the presence of the perfusion apparatus. In one embodiment, the perfusion apparatus may contribute to the substantially homogenous spatial distribution through the presence of one or more magnets or shim elements integrated into the perfusion apparatus.

Since the perfusion apparatus may be placed in or near a magnetic field associated with the MRI apparatus, the perfusion apparatus may be constructed from materials that include less than a threshold amount of ferromagnetic material. The threshold may be designed to prevent the perfusion apparatus from being moved by the magnetic field associated with the MRI apparatus. The MRI apparatus may be able to accommodate the presence of a certain amount of ferromagnetic material in the magnetic field. However, when that ferromagnetic material is moving, MRI operations can be complicated. Therefore, in one example, the perfusion apparatus is configured with less than a threshold amount of ferromagnetic material that moves.

Different embodiments may include different shielding configurations. For example, the perfusion apparatus may include a Faraday cage that is configured to block radio frequency (RF) emissions from leaving and/or entering a portion of the perfusion apparatus protected by the Faraday cage. Similarly, the perfusion apparatus may include an RF absorbing component (e.g., carbon fiber) configured to block RF emissions from leaving and/or entering a portion of the perfusion apparatus protected by the RF absorbing component.

The perfusion apparatus may need to move and/or circulate fluid. Therefore, in one example, the perfusion apparatus includes a motor. The motor may operate, at least in part, due to the presence of a magnetic field produced by the motor. This magnetic field may interfere with the MRI apparatus and/or may be interfered with by the MRI apparatus. Therefore, the motor may be configured to operate using a magnetic field associated with the MRI apparatus instead of using its own field generating magnet. Additionally, the motor may be positioned and oriented to minimize the impact of a magnetic field associated with the MRI apparatus on the operation of the motor. In different embodiments, rather than use a conventional motor, the motor may be one or more of, a pneumatic motor, a hydraulic motor, and a piezo-electric motor. The perfusion apparatus may also include a relay that may also be positioned and/or oriented to minimize the impact of a magnetic field associated with the MRI apparatus on the operation of the relay.

In one embodiment, an organ transport device may include an organ container configured to house an organ and a perfusion apparatus configured to perfuse an organ located in the organ container. The organ container may include a first connection configured to detachably connect the organ container to the perfusion apparatus. The organ container may be configured to be placed in a magnetic field produced by a magnetic resonance imaging apparatus. This may include being manufactured from non-ferromagnetic materials, including RF shielding and/or absorbing materials, and/or including magnets.

In one embodiment, the first connection is configured to detachably connect the organ container to a perfusion apparatus associated with the magnetic resonance apparatus. Thus, the organ transport device may be connected to one perfusion support apparatus (e.g., pump, oxygen supply) during transport and may be connected to another perfusion support apparatus after transit. In one example, the oxygen supply and/or pump may even be integrated into the MRI apparatus.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Logic", as used herein, includes but is not limited to hardware, firmware, instructions stored on a non-transitory medium or in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logics are described, it may be possible to incorporate the multiple logics into one physical logic. Similarly, where a single logic is described, it may be possible to distribute that single logic between multiple physical logics. One or more of the components and functions described herein may be implemented using one or more of the logic elements.

While for purposes of simplicity of explanation, illustrated methodologies are shown and described as a series of blocks. The methodologies are not limited by the order of the blocks as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks.

To the extent that the term "includes" or "including" is employed in the detailed description or the claims, it is intended to be inclusive in a manner similar to the term "comprising" as that term is interpreted when employed as a transitional word in a claim.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

What is claimed is:

1. A hypothermic pulsatile perfusion (HPP) apparatus, comprising:
a sterile, disposable inner liner configured to house an organ; and
one or more nuclear magnetic resonance (NMR) elements integrated into the HPP apparatus, the one or more NMR elements being configured to facilitate performing one or more of, magnetic resonance spectroscopy (MRS), and magnetic resonance imaging (MRI) on the organ, the one or more NMR elements comprising a magnet configured to contribute to a magnetic field suitable for use in one or more of, MRS and MRI of the organ;
the HPP apparatus being constructed from magnetic resonance (MR) compatible, non-ferromagnetic materials.

2. The HPP apparatus of claim 1, the organ being a kidney.

3. The HPP apparatus of claim 2, the inner liner being configured to maintain the kidney in a pre-determined kidney position relative to the one or more NMR elements and in a pre-determined kidney orientation relative to the one or more NMR elements.

4. The HPP apparatus of claim 3, the one or more NMR elements comprising a radio frequency (RF) coil.

5. The HPP apparatus of claim 4, the RF coil being positioned and oriented with respect to the pre-determined kidney position and the pre-determined kidney orientation to facilitate optimizing chemical shift $^{31}$P MRS of the kidney.

6. The HPP apparatus of claim 3, the RF coil being a $^{1}$H/$^{31}$P coil.

7. The HPP apparatus of claim 3, the RF coil being positioned and oriented with respect to the pre-determined kidney position and the pre-determined kidney orientation to facilitate performing one or more of, single-side spectroscopy on the kidney, and mobile spectroscopy on the kidney using a closed magnet.

8. The HPP apparatus of claim 1, the one or more NMR elements comprising a magnet configured to contribute to a magnetic field suitable for use in chemical shift MRS of the organ.

9. The HPP apparatus of claim 1, the one or more NMR elements comprising a magnet configured to facilitate unilateral NMR of an object outside the magnet.

10. The HPP apparatus of claim 9, the magnet being a closed magnet.

11. The HPP apparatus of claim 1, the one or more NMR elements comprising:
a magnet,
an RF coil, and
a shim pair,
where the magnet, the RF coil, and the shim pair are configured to facilitate single-sided spectroscopy of the organ.

12. The HPP apparatus of claim 11, the magnet being configured to create a magnetic field of 1.5 T or less.

13. The HPP apparatus of claim 1, further omprising one or more of:
a humidity monitoring apparatus;
a humidity control apparatus;
a light-level monitoring apparatus;
a light-level control apparatus;
a temperature monitoring apparatus; and
a temperature controlling apparatus.

14. The HPP apparatus of claim 1, the HPP apparatus having at least one portion configured to facilitate viewing the organ.

15. The HPP apparatus of claim 1, the HPP apparatus being configured to be placed in a dedicated NMR apparatus configured to perform one or more of, MRS, and MRI on the organ.

* * * * *